United States Patent [19]

Lee et al.

[11] Patent Number: 5,097,271

[45] Date of Patent: Mar. 17, 1992

[54] HIGH RESOLUTION THERMAL PRINTING DEVICE

[75] Inventors: Bae-Won Lee, Bucheon; Jin-Ku Kang; Hong-Geun Yang, both of Seoul, all of Rep. of Korea

[73] Assignee: SamSung Electronics Co., Ltd., Kyung Ki-Do, Rep. of Korea

[21] Appl. No.: 606,895

[22] Filed: Oct. 31, 1990

[30] Foreign Application Priority Data

May 3, 1990 [KR] Rep. of Korea ............... 1990-6259

[51] Int. Cl.$^5$ .................... B41J 2/34; G01D 15/10; G01D 15/16
[52] U.S. Cl. ............................................. 346/76 PH
[58] Field of Search .................................. 346/76 PH

[56] References Cited

U.S. PATENT DOCUMENTS

4,750,260  6/1988  Takeno et al. ............... 346/76 PH

FOREIGN PATENT DOCUMENTS

0007379  1/1983  Japan ............... 346/76 PH
0019556  1/1985  Japan ............... 346/76 PH

*Primary Examiner*—Benjamin R. Fuller
*Assistant Examiner*—Huan Tran
*Attorney, Agent, or Firm*—Robert E. Bushnell

[57] ABSTRACT

There is disclosed a high resolution thermal printing device including a 128-bit uni-directional integrated circuit, which is specially ordered, instead of a general integrated circuit. The electrical connection of the device is achieved by wedge wire bonding employing wedges. The integrated circuit has a plurality of power source connecting pads which are aligned on the central portion the integrated circuit in parallel with the transverse direction thereof.

11 Claims, 4 Drawing Sheets

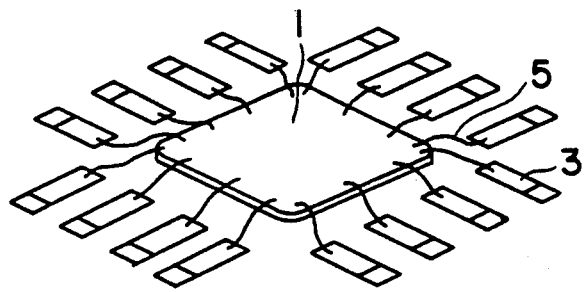
FIG. IA
(PRIOR ART)
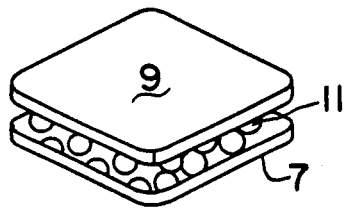
FIG. IB
(PRIOR ART)
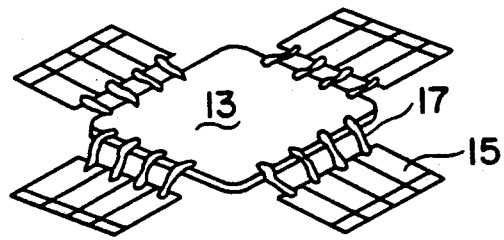
FIG. IC
(PRIOR ART)

HIGH RESOLUTION THERMAL PRINTING DEVICE

BACKGROUND OF THE INVENTION

This invention concerns a thermal printing device, and particularly an integrated circuit for driving the thermal printing device and an assembling method therefor.

A thermal printing device includes an alumina or ceramic insulating substrate coated with a glaze, a plurality of heat generating resistors arranged on the insulating substrate, and an integrated circuit for driving the heat generating resistors, whereby each bit of the integrated circuit (IC) is supplied with the processed digital pulses, so that each bit independently makes a switching operation according to the pulses so as to drive the heat generating resistor connected thereto. Then, the heat produced by the current flowing through the heat generating resistor is transmitted to a heat-sensitive paper to blacken portions thereof, thus accomplishing the printing operation. Namely, the thermal printing device converts digital signals into an image by means of the heat produced from the heat generating resistor.

As the number of heat generating resistors per inch is increased, the resolution of the printing is improved. Conventionally, the thermal printing device with a high resolution such as 300 dpi (dots per inch; dots/inch) and 400 dpi may be obtained as follows:

First, a number of 64-bit bi-directional driving integrated circuits for 64-bit wire bonding in which the output pads are scatteredly arranged on both edge portions thereof longitudinally mounted on a substrate.

Second, instead of using the wire bonding to connect portions with gold wires, there are formed solder or gold bumps on the portions to be connected, in which the solder or gold bumps are connected to each other, which produces a flip or bump chip as a general driving integrated circuit.

Third, there is used a general driving integrated circuit exclusively using a tape automated bonding (T.A.B.) method which includes the steps of adhering a tape to the portions where gold wires are put by using solder or gold bump, arranging a thin wire on the central portion of the tape, and connecting the wires to each other.

All of the above three cases use the same method in forming heat generating resistors and signal distribution lines on an insulating substrate, but they use a different method in forming an electrical connection between a printed circuit board and a driving integrated circuit.

Referring to FIGS. 1A, 1B and 1C that illustrate conventional assembling methods, FIG. 1A shows the assembling method of using the wire bonding, wherein a thin gold wire 5 is used to connect semiconductor chip 1 and pad portion 3, Fig 1B shows the assembling method of using the flip chip, wherein a gold bump is used to connect substrate 7 and semiconductor chip 9, and FIG. 1C shows the assembling method of using the TAB method, wherein a tape 17 is used to connect semiconductor chip 13 and pad portion 15.

Comparing the three assembling methods, the wire bonding and the TAB method employ only the edge portions of the chip, so that the minimum pitch between the bonding pads limits increase of the resolution. Namely, the minimum pitch is respectively about 135 and 80 μm for the wire bonding and TAB method. As the thermal printing device gains higher resolution, the pitch becomes smaller. Hence, if the pitch would be reduced below the minimum value, the bonding pads become adhered to each other. On the other hand, the flip chip has a minimum pitch of about 250 μm greater than the minimum pitch obtained by the wire bonding and TAB method, but the bonding pads may be arranged on the whole surface of the chip so that the pattern of the signal distribution lines makes it possible to achieve a high resolution.

Referring to FIGS. 2A-2C for illustrating power source ground pads (GND pads) and internal signal distribution lines formed in a conventional driving integrated circuit, FIG. 2A shows the three GND pads 21 and the internal signal distribution lines 23 thereof formed in integrated circuit 20, FIG. 2B shows the five GND pads 25 and the internal signal distribution lines 27 thereof formed in integrated circuit 20, and FIG. 2C shows the nine GND pads 29 and the internal signal distribution lines 31 thereof formed in integrated circuit 20.

If the number of the bits of the driving integrated circuit shown in FIG. 2A is 128, the power source ground pads are respectively positioned on the three places indicating 1st bit, 64th bit and 128th bit. In this case, the values of the driving voltages applied to the bit positions forming the power source ground pads, i.e., 1st, 64th and 128th positions, considerably differ from the values of the driving voltages applied to the intermediate positions between the power source ground pads, i.e., 32nd and 96 bit positions due to great path differences.

Of course, although, as shown in FIGS. 2B and 2C, as the number of the power source ground pads 25, 29 is increased more than in the case of FIG. 2A, the voltage differences between the bit positions forming the power source ground pads and the intermediate positions are reduced, they still continue to have considerable values.

The drawbacks of the conventional assembling methods and of forming the power source ground pads are enumerated as follows:

First, in the wire bonding and the TAB method, since the minimum pitch is limited to a specific degree, the increase of the resolution can not be implemented easily.

Second, when assembling 64-bit bi-directional integrated circuit by using the wire bonding, the chip has to be mounted longitudinally on the substrate, so that the size of the product is increased.

Third, the manufacturing process is difficult, and the reliability of the product is hardly secured. Namely, when assembling the 64-bit bi-directional integrated circuit by using the wire bonding, there should be formed an insulating layer beneath the integrated circuit in order to insulate the substrate from the chip, which makes the process complicated. Moreover, when forming the pattern of the signal distribution lines, they are bent into L-shaped forms, and as the resolution is increased, the signal line distribution width is reduced, and also the bent portions are increased, thereby decreasing the reliability of the final product. When employing the flip chip method, since the solder or gold bump has to be melted by momentarily applied heat, which exerts a thermal shock to the device to possibly produce defects therein. Furthermore, since the solder or gold bump is to be arranged in a specified position, high precision technique is required. Also, the T. A. B.

method needs a separate tape carrier film exclusively used, and complicates the process.

Fourth, when the power source ground pads are arranged on the edge portions of the integrated circuit in line with the other signal pads, the path differences of the internal signal distribution lines cause differences in the local printing concentration. Namely, the external digital signals of the integrated circuit inputted into the power source ground pads are transmitted through the internal signal distribution lines to the heat generating resistors. In this case, if, as shown in FIGS. 2A-2C, the power source ground pads are arranged on the edge portions of the integrated circuit in line with the other signal pads, there result in the path differences of the signal distribution lines in accordance with the number and positions of the power source ground pads on the integrated circuit, and thus the differences of the resistance values, which cause the differences of the driving voltages applied to the bits of the driving integrated circuit chip so as to effect the differences of the local printing concentration. These phenomena become more prevalent as the thermal printing device gets the higher resolution, i.e., the number of the driving bits is increased.

SUMMARY OF THE INVENTION

It is an object of the present invention to provide a thermal printing device having a high resolution in the order of 300 dpi or 400 dpi.

It is another object of the present invention to provide a compact thermal printing device.

It is a further object of the present invention to provide a thermal printing device which facilitates the manufacturing process and secures high reliability.

It is still another object of the present invention to provide a thermal printing device wherein the path differences of the internal signal distribution lines resulting from the power source ground pads formed on the driving integrated circuit have the minimum value.

According to the present invention, a high resolution thermal printing device includes a 128-bit uni-directional integrated circuit in which the output pads are arranged on one edge portion thereof, which is specially ordered, instead of a general integrated circuit. The electrical connection of the device is achieved by wedge wire bonding employing wedges.

The present invention will now be described more specifically with reference to the drawings attached only by way of example.

BRIEF DESCRIPTION OF THE ATTACHED DRAWINGS

FIGS. 1A-1C illustrate the conventional method of assembling a thermal printing device;

DETAILED DESCRIPTION OF A PREFERRED EMBODIMENT

Figure 2A:
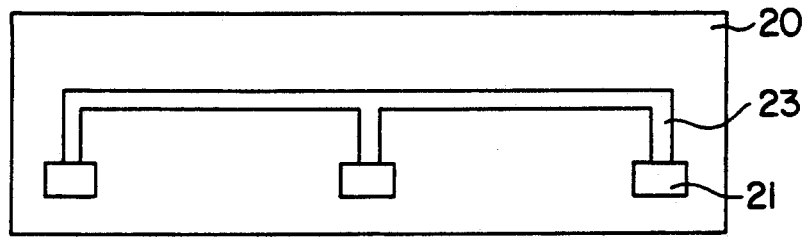
FIGS. 2A-2C illustrate power source ground pads formed in a conventional driving integrated circuit.
Figure 2B:
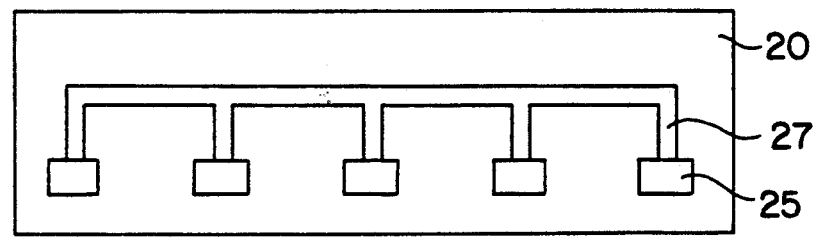
Figure 2C:
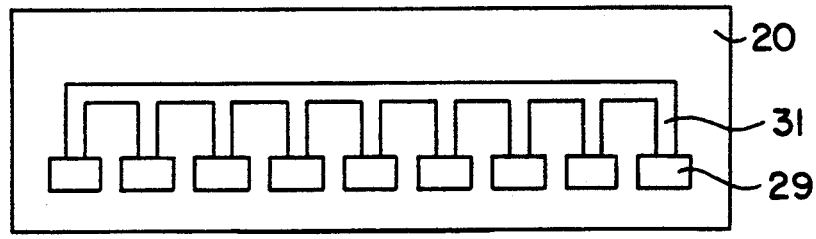
Figure 3:
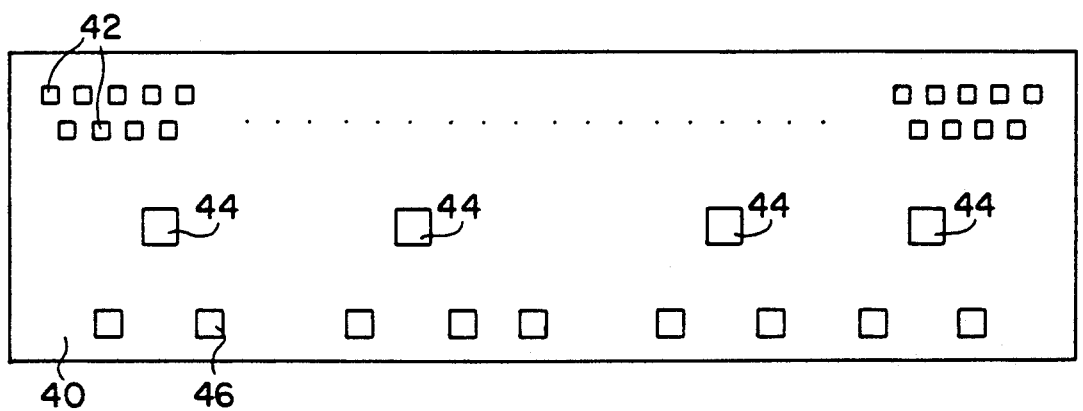
FIG. 3 is a plane view for illustrating the power source ground pads formed on the inventive driving integrated circuit.

Referring to FIG. 3, a plurality of input signal distribution line pads 46 are formed on one of the transverse edge portions of driving integrated circuit 40, a plurality of output pads 42 are formed on the other transverse edge portion thereof, and a plurality of power source ground pads 44 are formed on the transverse central portion thereof. The externally processed digital pulses are applied to the input signal distribution line pads 46, in which pulses cause each bit of the driving integrated circuit 40 to make switching operations in order to drive the heat generating resistors of the thermal printing device via the output pads 42. In the embodiment, the output pads 42 are arranged in two rows, so that, in the case of 128 bits, the pads are arranged in two rows each having 64 pads, thus facilitating the formation of the signal distribution line pads compared with a single row construction.

Thus, as shown in FIG. 3, it will be noted that, since the power source ground pads 44 are arranged on the central portion of the driving integrated circuit in parallel with the transverse direction of the chip, the distance of the signal distribution lines from the edge of the chip to the central portion thereof is reduced compared with the conventional chip having the power source ground pads on the edge portions thereof, so that the voltage differences according to the internal signal distribution lines that chiefly cause the differences of the local printing concentration are almost eliminated even in case of using the considerably reduced number of the power source ground pads 44.

Figure 4:
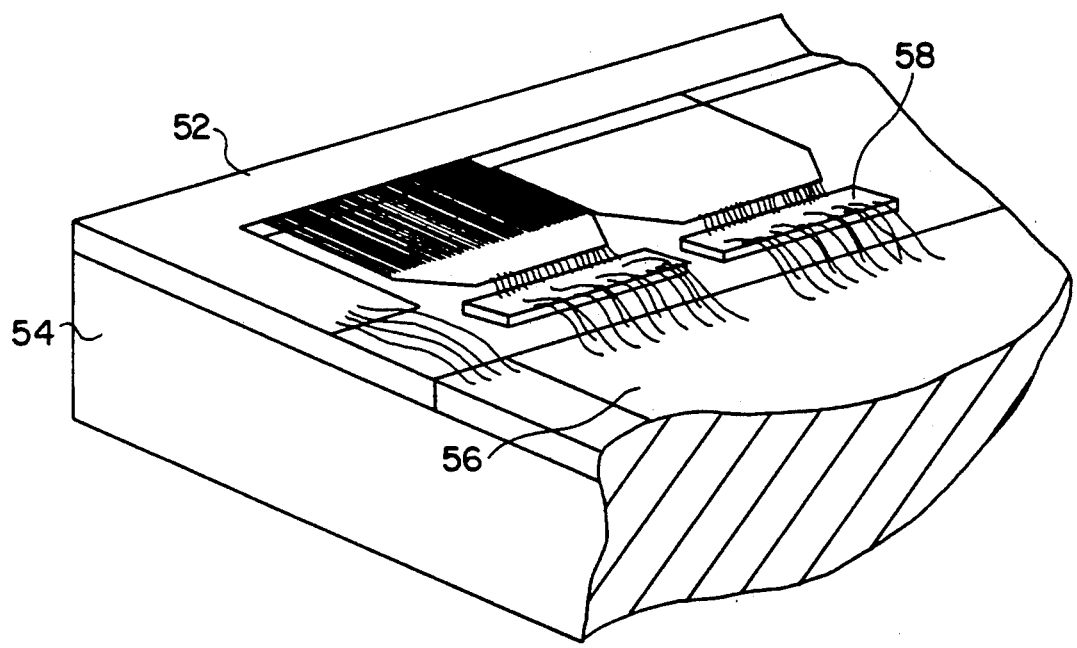
FIG. 4 is a perspective view for illustrating the whole assemblage of the inventive thermal printing device.

Referring to FIG. 4, the thermal printing device includes substrate 52, heat radiating plate 54, printed circuit board 56 and driving integrated circuit 58. In this case, the heat produced by the operations of the heat generating resistors, the driving integrated circuit 58, and the printed circuit board 56, are radiated through the heat radiating plate 54. The substrate 52 attached on the heat radiating plate 54 includes a ceramic insulating plate or an insulating plate coated with a glaze, on which a resistor film and an aluminum (Al) film of the signal distribution lines are deposited by sputtering or vacuum vapor deposition, subjected to photolithography process so as to form the heat generating resistors and the pattern of the signal distribution lines. Then, there is mounted thereon the driving integrated circuit, which includes a 128-bit uni-directional chip having enough power source ground pads arranged on the central regions thereof. There are shown four power source ground pads in FIG. 3. The wedge wire bonding is employed along with special wedges to electrically connect each bit pad of the driving integrated circuit with the aluminum pads of the signal distribution lines, the input signal pads of the integrated circuit chip with the printed circuit board 56, and the power source ground pads arranged on the central portions of the integrated circuit chip with the power source ground terminal on the printed circuit board 56.

The driving integrated circuit is mounted transversely on the substrate so as to considerably reduce the width of the final product, as shown in FIG. 4, and the power source ground pads are arranged on the central portions of the driving integrated circuit in parallel with the transverse direction thereof, thereby minimizing the voltage drop caused by the ground distribution line. The wedge wire bonding employs wedges instead of the capillary used in the ball stitch wire bonding, so that the ball is not formed during bonding, thus minimizing the bonding pitch. The minimum pitch between the respective bits achieved by the wedge wire bonding is about 116 μm.

As described above, the present invention reduces the minimum pitch by employing the wedge wire bonding, so that there is obtained a high resolution thermal printing device. Also, the driving integrated circuit of the uni-directional type makes it possible to decrease the width of the product, compared to the bidirectional type. Further, the electrical connection achieved by employing the wedge wire bonding minimizes the length of the external signal distribution lines, and eliminates the insulating layer beneath the chip that is necessary for the conventional device, and the bent portions of the signal distribution lines, so as to facilitate the process and to improve the reliability of the product. Besides, there is no thermal shock inherent on the flip chip method, so that there do not occur the defects caused thereby. Additionally, the inventive device does not require high precision technique necessary for arranging the solder bumps on the flip chip method, a separate tape carrier film exclusively used in the TAB method, and the gold bump, thus reducing the production cost as well as facilitating the process. Of course, the power source ground pads are arranged on the central portions of the driving integrated circuit in parallel with the transverse direction thereof, so that the path difference according to the internal signal distribution lines is minimized so as to achieve a thermal printing device with a high quality printing concentration.

What is claimed is:

1. A thermal printing device comprising:
   heat generating means;
   a plurality of internal signal distribution lines coupled to said heat generating means;
   a printed circuit board for receiving printing data;
   means for radiating heat produced by operation of said heat generating means and said printed circuit board; and
   a plurality of driving integrated circuits for driving said heat generating means, each of said driving integrated circuits comprising:
   a number of output pads coupled electrically to said heat generating means facing forward toward said heat generating means;
   wherein a number of input pads coupled electrically to said printed circuit board facing forward of said printed circuit board;
   said driving integrated circuits being disposed in series to one another between said internal signal distribution lines and said heat generating means, each of said driving integrated circuits being a 128-bit uni-directional driving integrated circuit.

2. A thermal printing device as claimed in claim 1, characterized in that each of said driving integrated circuits comprises a plurality of power source ground pads which are arranged on a central portion of each of said driving integrated circuits in parallel with a transverse direction thereof.

3. A thermal printing device as claimed in claim 1, characterized in that said output pads are transversely arranged in two rows on an edge portion of each of said driving integrated circuits, facing toward said heat generating means.

4. A thermal printing device as claimed in claim 1, characterized in that said internal signal distribution lines and said driving integrated circuits are electrically coupled to said printed circuit boards by wedge wire bonding, electrically connected portions of said wedge wire bonding having a wedge shape.

5. A thermal printing device having heat generating means, a plurality of internal signal distribution lines coupled to said heat generating means, a printed circuit board for receiving printing data, means for radiating heat produced by operation of said heat generating means and said printed circuit board, and a plurality of driving integrated circuits for driving said heat generating means each of said driving integrated circuits comprising:

a plurality of output pads coupled electrically to said heat generating means, said output pads being mounted on one transverse edge of said driving integrated circuit and adjacent said heat generating means;

a plurality of input pads coupled electrically to said printed circuit board, said input pads being mounted on an opposite transverse edge of each of said driving integrated circuits and adjacent said printed circuit board; and a plurality of power source ground pads arranged on a central portion of each of said driving integrated circuits in parallel with a transverse direction thereof;

said driving integrated circuits being disposed adjacent to one another between said internal signal distribution lines and said heat generating means, said driving integrated circuits being 128-bit uni-directional driving integrated circuits.

6. A thermal printing device as claimed in claim 5, characterized in that said output pads are transversely arranged in two rows on said one transverse edge portion of each of said driving integrated circuits and adjacent said heat generating means.

7. A thermal printing device as claimed in claim 5, characterized in that said internal signal distribution lines and said driving integrated circuits are electrically coupled to said printed circuit boards by wedge wire bonding, electrically connected portions of said wedge wire bonding having a wedge shape.

8. A thermal printing device comprising:
   heat generating means;
   a plurality of internal signal distribution lines coupled to said heat generating means;
   a printed circuit board for receiving printing data;
   means for radiating heat produced by operation of said heat generating means and said printed circuit board; and
   a plurality of driving integrated circuits for driving said heat generating means, each of said driving integrated circuits comprising:
   a plurality of output pads electrically coupled and adjacent to said heat generating means;
   a plurality of input pads electrically coupled, by wedge wire bonding to said printed circuit board, electrically connected portions of the wedge wire bonding having a wedge shape;
   said driving integrated circuits being disposed adjacent to one another between said internal signal distribution lines and said heat generating means, each of said driving integrated circuits being a 128-bit uni-directional driving integrated circuit.

9. A thermal printing device as claimed in claim 8, further comprised of said driving integrated circuits comprising a plurality of power source ground pads arranged on a central portion of each of said driving integrated circuits in parallel with a transverse direction thereof and electrically coupled to power source ground terminals on said printed circuit board by wedge wire bonding, electrically connected portions of the wedge wire bonding having a wedge shape.

10. A thermal printing device as claimed in claim 8, characterized in that said output pads are transversely arranged in two rows on an edge portion of each of said driving integrated circuits adjacent said heat generating means.

11. A thermal printing device as claimed in claim 2, characterized in that said output pads are transversely arranged in two rows on an edge portion of each of said driving integrated circuits, facing toward said heat generating means.

* * * * *

UNITED STATES PATENT AND TRADEMARK OFFICE
CERTIFICATE OF CORRECTION

PATENT NO. : 5,097,271
DATED : March 17, 1992
INVENTOR(S) : Bae-Won Lee, et al

It is certified that error appears in the above-indentified patent and that said Letters Patent is hereby corrected as shown below:

Column 1    Line 32,    after "pads", delete "are";

Line 33,    after "thereof", insert --are--;

Line 56,    change "FIG 1B" to --FIG. 1B--:

Signed and Sealed this

Twenty-fourth Day of October, 1995

Attest:

BRUCE LEHMAN

*Attesting Officer*     *Commissioner of Patents and Trademarks*